United States Patent
Oh et al.

(10) Patent No.: US 12,376,453 B2
(45) Date of Patent: Jul. 29, 2025

(54) LIGHT EMITTING DISPLAY APPARATUS

(71) Applicant: LG DISPLAY CO., LTD., Seoul (KR)

(72) Inventors: Saehoon Oh, Paju-si (KR); Taehan Park, Paju-si (KR); Yongjae Kim, Paju-si (KR)

(73) Assignee: LG Display Co., Ltd. (KR)

( * ) Notice: Subject to any disclaimer, the term of this patent is extended or adjusted under 35 U.S.C. 154(b) by 474 days.

(21) Appl. No.: 17/965,925

(22) Filed: Oct. 14, 2022

(65) Prior Publication Data

US 2023/0217695 A1 Jul. 6, 2023

(30) Foreign Application Priority Data

Dec. 31, 2021 (KR) .................. 10-2021-0194755

(51) Int. Cl.
*H10D 86/40* (2025.01)
*H10H 20/832* (2025.01)
*H10K 50/86* (2023.01)
*H10K 59/124* (2023.01)
*H10K 59/131* (2023.01)

(52) U.S. Cl.
CPC ........... *H10K 50/86* (2023.02); *H10K 50/865* (2023.02); *H10K 59/124* (2023.02); *H10K 59/131* (2023.02)

(58) Field of Classification Search
CPC .... H10K 50/86; H10K 50/865; H10K 59/124; H10K 59/131; H10K 59/8792; H10K 59/8791; H10K 59/126; H10K 59/121; G09F 9/33; H10H 20/835; H10D 86/40; H10D 86/441; H10D 86/60
See application file for complete search history.

(56) References Cited

U.S. PATENT DOCUMENTS

| | | | |
|---|---|---|---|
| 9,859,354 B2* | 1/2018 | Kang | ............ H10K 59/38 |
| 2016/0049454 A1 | 2/2016 | Park et al. | |
| 2020/0019015 A1 | 1/2020 | Tsuchiya et al. | |
| 2021/0043870 A1 | 2/2021 | Baek et al. | |

FOREIGN PATENT DOCUMENTS

| | | |
|---|---|---|
| KR | 2004-0050772 A | 6/2004 |
| KR | 2018-0038170 A | 4/2018 |

OTHER PUBLICATIONS

European Office Action dated May 8, 2023 issued in Patent Application No. 22201486.2 w/English Translation (10 pages).

* cited by examiner

*Primary Examiner* — David Vu

(74) *Attorney, Agent, or Firm* — Fish & Richardson P.C.

(57) ABSTRACT

A light emitting display apparatus includes a substrate, a pixel driving circuit layer provided in the substrate, a planarization layer provided on the pixel driving circuit layer, and an anode electrode provided on the planarization layer, wherein the anode electrode is connected to a driving transistor included in the pixel driving circuit layer, the pixel driving circuit layer includes a first main electrode and a second main electrode provided on the first main electrode with an insulation layer therebetween, and a first low reflection electrode is provided under the first main electrode, and a second low reflection electrode is provided under the second main electrode.

20 Claims, 7 Drawing Sheets

LIGHT EMITTING DISPLAY APPARATUS

CROSS-REFERENCE TO RELATED APPLICATION

This application claims the priority of Korean Patent Application No. 10-2021-0194755 filed on Dec. 31, 2021, which is hereby incorporated by reference in its entirety.

BACKGROUND

Field of the Disclosure

The present disclosure relates to a light emitting display apparatus.

Description of the Background

A polarization film is attached on a light emitting display panel for a light emitting display apparatus, so as to prevent the reflection of external light.

In this case, because the polarization film should be added, the manufacturing cost of light emitting display apparatuses increases, and because a process of attaching the polarization film on the light emitting display panel should be added, a manufacturing process of light emitting display apparatuses becomes complicated.

Moreover, a thickness of light emitting display apparatuses increases due to the polarization film, and due to this, the requirements of users for decreasing a thickness of light emitting display apparatuses cannot be satisfied.

SUMMARY

Accordingly, the present disclosure is to provide a light emitting display apparatus that substantially obviates one or more problems due to limitations and disadvantages of the related art.

More specifically, the present disclosure is to provide a light emitting display apparatus in which a low reflection electrode is provided under a main electrode included in a pixel driving circuit layer and lateral surfaces of the low reflection electrode and the main electrode are covered by a black material.

Additional advantages and features of the disclosure will be set forth in part in the description which follows and in part will become apparent to those having ordinary skill in the art upon examination of the following or may be learned from practice of the disclosure. Other advantages of the disclosure may be realized and attained by the structure particularly pointed out in the written description and claims hereof as well as the appended drawings.

To achieve these and other advantages and in accordance with the purpose of the disclosure, as embodied and broadly described herein, a light emitting display apparatus includes a substrate, a pixel driving circuit layer provided in the substrate, a planarization layer provided on the pixel driving circuit layer, and an anode electrode provided on the planarization layer, wherein the anode electrode is connected to a driving transistor included in the pixel driving circuit layer, the pixel driving circuit layer includes a first main electrode and a second main electrode provided on the first main electrode with an insulation layer therebetween, and a first low reflection electrode is provided under the first main electrode, and a second low reflection electrode is provided under the second main electrode.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings.

DETAILED DESCRIPTION

Figure 1:
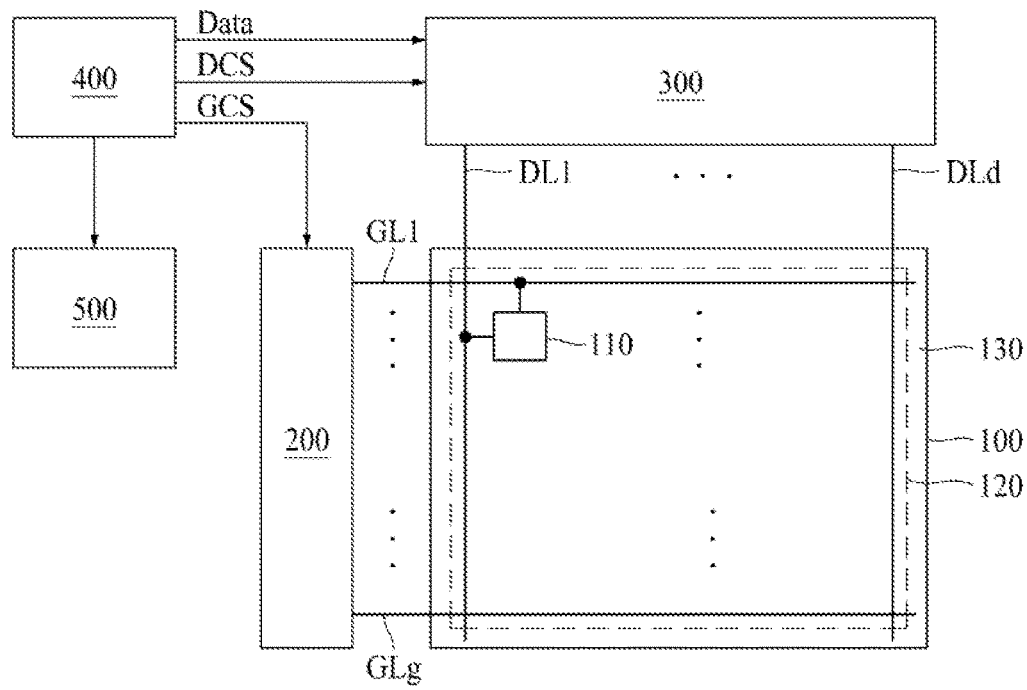
FIG. 1 is an exemplary diagram illustrating a configuration of a light emitting display apparatus according to the present disclosure.

Reference will now be made in detail to the exemplary aspects of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. When "comprise," "have," and "include" described in the present specification are used, another part may be added unless "only" is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case that is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," "A," "B," "(a)," "(b)," etc. may be used. These terms are intended to identify the corresponding elements from the other elements, and basis, order, or number of the corresponding elements should not be limited by these terms. The expression that an element is "connected," "coupled," or "adhered" to another element or layer the element or layer can not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, aspects of the present disclosure will be described in detail with reference to the accompanying drawings.

Figure 2:
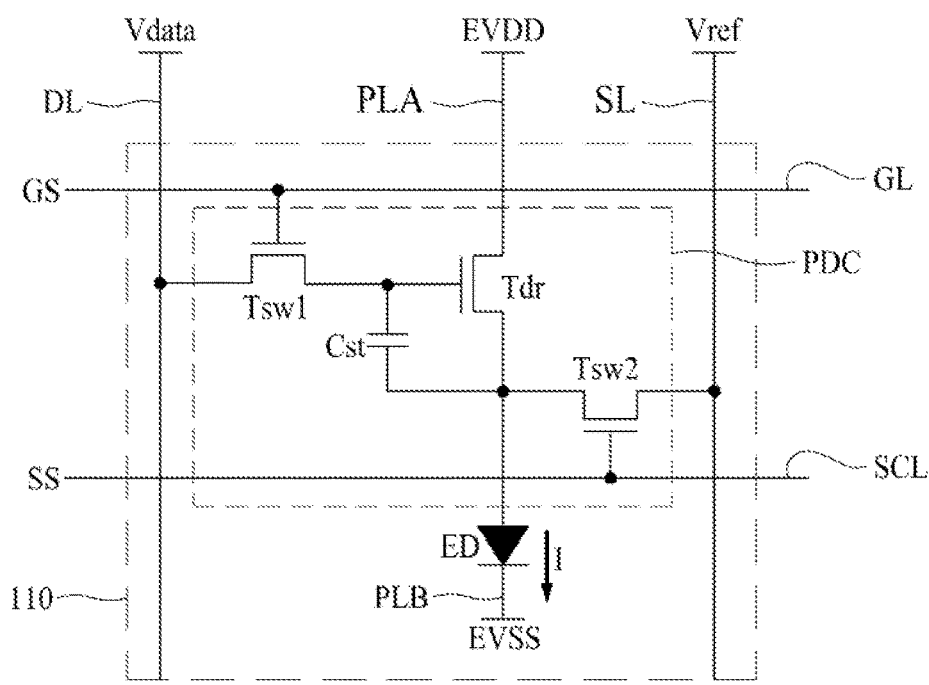
FIG. 2 is an exemplary diagram illustrating a structure of a pixel for a light emitting display apparatus according to the present disclosure.

FIG. 1 is an exemplary diagram illustrating a configuration of a light emitting display apparatus according to the present disclosure, and FIG. 2 is an exemplary diagram illustrating a structure of a pixel for a light emitting display apparatus according to the present disclosure.

The light emitting display apparatus according to the present disclosure may configure various electronic devices. The electronic devices may include, for example, smartphones, tablet personal computers (PCs), televisions (TVs), and monitors.

The light emitting display apparatus according to the present disclosure, as illustrated in FIG. 1, may include a light emitting display panel 100 which includes a display area 120 for displaying an image and a non-display area 130 provided outside the display area 120, a gate driver 200 for supplying a gate signal to a plurality of gate lines GL1 to GLg provided in the display area 120 of the light emitting display panel 100, a data driver 300 which supplies data voltages to a plurality of data lines DL1 to DLd provided in the light emitting display panel 100, a controller 400 which controls driving of the gate driver 200 and the data driver 300, and a power supply 500 which supplies power to the controller 400, the gate driver 200, the data driver 300, and the light emitting display panel 100.

First, the light emitting display panel 100 may include the display area 120 and the non-display area 130.

The pixels 110 for displaying an image may be provided in the display area 120, and the non-display area 130 at least partly or fully surrounds the display area 120.

The gate lines GL1 to GLg, the data lines DL1 to DLd, and the pixels 110 may be provided in the display area 120. Accordingly, the display area 120 may display an image. Here, g and d may each be a natural number.

The pixel 110 included in the light emitting display panel 100, as illustrated in FIG. 2, may include an emission area which includes a pixel driving circuit PDC, including a switching transistor Tsw1, a storage capacitor Cst, a driving transistor Tdr, and a sensing transistor Tsw2, and a light emitting device ED.

A first terminal of the driving transistor Tdr may be connected to a high voltage supply line PLA through which a high voltage EVDD is supplied, and a second terminal of the driving transistor Tdr may be connected to the light emitting device ED. A second electrode of the light emitting device ED may be connected to a low voltage supply line PLB through which a low voltage EVSS is supplied.

A first terminal of the switching transistor Tsw1 may be connected to the data line DL, a second terminal of the switching transistor Tsw1 may be connected to a gate of the driving transistor Tdr, and a gate of the switching transistor Tsw1 may be connected to a gate line GL.

A data voltage Vdata may be supplied to a data line DL, and a gate signal GS may be supplied to the gate line GL.

The sensing transistor Tsw2 may be provided for measuring a threshold voltage or mobility of the driving transistor. A first terminal of the sensing transistor Tsw2 may be connected to a second terminal of the driving transistor Tdr and the light emitting device ED, a second terminal of the sensing transistor Tsw2 may be connected to a reference voltage line RL through which a reference voltage Vref is supplied, and a gate of the sensing transistor Tsw2 may be connected to a sensing control line SCL through which a sensing control signal SS is supplied.

A structure of the pixel 110 included in the light emitting display panel 100 is not limited to a structure illustrated in FIG. 2. Accordingly, a structure of the pixel 110 may be changed to various types.

Various metal electrodes and an insulation layer configuring the pixels 110 may be provided on a base substrate (hereinafter simply referred to as a substrate) such as a film or a glass substrate. That is, the light emitting display panel 100 may include a substrate, and insulation layers and metal electrodes provided on the substrate.

The data driver 300 may be mounted on a chip on film (COF) attached on the display panel 100. In this case, the data driver 300 may be connected to the controller 400 and the data lines DL1 to DLd included in the light emitting display panel 100.

The data driver 300 may be directly equipped in the light emitting display panel 100, and then, may be connected to the controller 400 provided on the main substrate.

The data driver 300 may be implemented as one integrated circuit (IC) along with the controller 400. In this case, the IC may be mounted on a COF, or may be directly equipped in the light emitting display panel 100.

The controller 400 may realign input video data transferred from an external system by using a timing synchronization signal transferred from the external system and may generate data control signals DCS which are to be supplied to the data driver 300 and gate control signals GCS which are to be supplied to the gate driver 200.

To this end, the controller 400 may include a data aligner which realigns input video data to generate image data Data and supplies the image data Data to the data driver 300, a control signal generator which generates the gate control signal GCS and the data control signal DCS by using the timing synchronization signal, an input unit which receives the timing synchronization signal and the input video data transferred from the external system and respectively transfers the timing synchronization signal and the input video data to the data aligner and the control signal generator, and an output unit which supplies the data driver 300 with the image data Data generated by the data aligner and the data control signal DCS generated by the control signal generator and supplies the gate driver 200 with the gate control signals GCS generated by the control signal generator.

The external system may perform a function of driving the controller 400 and an electronic device. For example, when the electronic device is a TV, the external system may receive various sound information, video information, and letter information over a communication network and may transfer the received video information to the controller 400. In this case, the image information may include input video data.

The power supply 500 may generate various powers and may supply the generated powers to the controller 400, the gate driver 200, the data driver 300, and the light emitting display panel 100.

Finally, the gate driver 200 may supply gate pulses to the gate lines GL1 to GLg. When the gate pulse generated by the gate driver 200 is supplied to the gate of the switching transistor Tsw1 included in the pixel 110, the switching transistor Tsw1 may be turned on. When the switching transistor Tsw1 is turned on, a data voltage supplied through the data line may be supplied to the pixel 110. When a gate off signal generated by the gate driver 200 is supplied to the switching transistor Tsw1, the switching transistor Tsw1 may be turned off. When the switching transistor Tsw1 is turned off, the data voltage may not be supplied to the pixel 100 any longer. The gate signal GS supplied to the gate line GL may include the gate pulse and the gate off signal.

Figure 3:
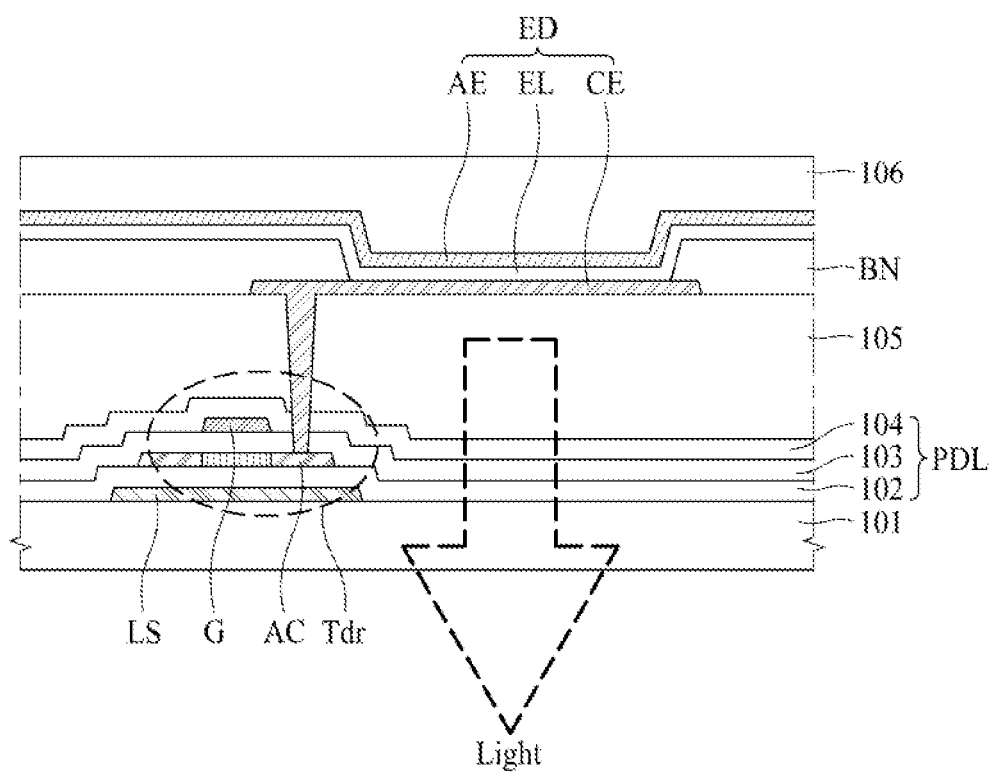
FIG. 3 is a cross-sectional view of a light emitting display panel of a light emitting display apparatus according to the present disclosure.

FIG. 3 is a cross-sectional view of a light emitting display panel for a light emitting display apparatus according to the present disclosure, and particularly, is a cross-sectional view illustrating a driving transistor Tdr and a light emitting device ED.

A light emitting display panel applied to the present disclosure, as illustrated in FIG. 3, may include a substrate 101, a pixel driving circuit layer PDL which is provided on the substrate 101, a planarization layer 105 which is provided on the pixel driving circuit layer PDL and covers the pixel driving circuit layer PDL, an anode electrode AE which is provided on the planarization layer 105, a light emitting layer EL which is provided on the anode electrode AE, a cathode electrode CE which is provided on the light emitting layer EL, and an encapsulation layer 106 which covers the cathode electrode CE.

First, the substrate 101 may be a glass substrate or a plastic substrate, and moreover, may include various kinds of films.

The pixel driving circuit layer PDL including a driving transistor Tdr may be provided on the substrate 101.

A pixel driving circuit PDC including the driving transistor Tdr may be provided in the pixel driving circuit layer PDL. The pixel driving circuit PDC, as described above with reference to FIG. 2, may include a switching transistor Tsw1, a storage capacitor Cst, a driving transistor Tdr, and a sensing transistor Tsw2. That is, the pixel driving circuit layer PDL may include at least two transistors. Other circuits layouts may be possible having more transistors and/or capacitors.

Each of the transistors may include an active layer AC including a semiconductor, a gate insulation layer 103 which is provided on the active layer AC, and a gate G which is provided on the gate insulation layer 103. The gate G may be covered by the passivation layer 104, and the passivation layer 104 may be covered by the planarization layer 105.

For example, the driving transistor Tdr may include an active layer AC which is provided on a buffer 102, a gate insulation layer 103 which is provided on the active layer AC, a gate G which is provided on the gate insulation layer 103, and a passivation layer 104 which covers an upper end of the gate G. In this case, the other transistors may be configured as a type similar to the driving transistor Tdr illustrated in FIG. 3.

However, a structure of each of the driving transistor Tdr and the other transistors is not limited to a structure of the driving transistor Tdr illustrated in FIG. 3. That is, a structure of each of the driving transistor Tdr and the other transistors may be changed to various types.

In this case, as illustrated in FIG. 3, a light blocking plate LS may be provided under the driving transistor Tdr, so as to block external light penetrating into the active layer AC during manufacturing of a light emitting display apparatus or in using the light emitting display apparatus. Also, the light blocking plate LS may be connected to one of a gate, a first gate electrode, and a second gate electrode of the driving transistor Tdr. Also, the light blocking plate LS may be used as various lines (for example, a data line). Accordingly, the light blocking plate LS may be provided in a floating state and may also be connected to a signal line through which a voltage is supplied. In this case, the light blocking plate LS provided in a floating state or the light blocking plate LS connected to the signal line may be a first electrode.

The light blocking plate LS may be provided under the other transistors included in the pixel driving circuit layer PDL, or may not be provided. That is, the light blocking plate LS may be provided at a lower end of the other transistor requiring blocking of light, in addition to a lower end of the driving transistor Tdr, or may be provided in a region requiring blocking of light among regions where a transistor is not provided.

The light blocking plate LS may be provided on the substrate 101 and may be covered by the buffer 102, and the active layer AC may be provided on the buffer 102.

Moreover, the pixel driving circuit layer PDL may include a data line DL, a gate line GL, a sensing control line SCL, a sensing line SL, and a voltage supply line PLA, which are connected to the pixel driving circuit PDC.

Hereinafter, the data line DL, the gate line GL, the sensing control line SCL, the sensing line SL, and the voltage supply line PLA may be referred to as a signal line. That is, at least one signal line may be included in the pixel driving circuit layer PDL.

Each of the buffer 102, the gate insulation layer 103, and the passivation layer 104 may be formed of at least one inorganic layer or at least one organic layer, or may be formed of at least one inorganic layer and at least one organic layer. The buffer 102, the gate insulation layer 103, and the passivation layer 104 may be referred to as an insulation layer. The passivation layer 104 may be omitted.

The gate of the driving transistor Tdr, the light blocking plate LS, and the signal lines may include metal. A layer including at least one of the gate, the light blocking plate LS, and the signal line may be referred to as a metal layer.

That is, at least two metal layers and at least two insulation layers may be included in the pixel driving circuit layer PDL.

The planarization layer 105 may be provided on the pixel driving circuit layer PDL.

The planarization layer 105 may perform a function of planarizing an upper surface of the pixel driving circuit layer PDL which is not flat. That is, the planarization layer 105 may be formed to have a thickness which is greater than that of the pixel driving circuit layer PDL, and thus, the upper surface of the planarization layer 105 may be a flat surface.

The planarization layer 105 may be formed of at least one inorganic layer or at least one organic layer, or may be formed of at least one inorganic layer and at least one organic layer.

The anode electrode AE may be provided on the planarization layer 105. The anode electrode AE may configure a part of the light emitting device ED.

The anode electrode AE, as illustrated in FIGS. 2 and 3, may be electrically connected to the driving transistor Tdr included in the pixel driving circuit layer PDL and may be patterned for each pixel 110.

The anode electrode AE may include a transparent electrode such as indium tin oxide (ITO) and indium zinc oxide (IZO).

That is, in the light emitting display panel applied to the present disclosure, as illustrated in FIG. 3, light emitted from the light emitting device ED may be irradiated in a direction toward the substrate 101 (i.e., a direction toward a lower end of the light emitting display panel). Such an emission type may be referred to as a bottom emission type.

In this case, light emitted from the light emitting layer EL should pass through the anode electrode AE. Accordingly, the anode electrode AE may include a transparent electrode.

A bank BN may be provided on the planarization layer 105 and may include an opening portion which exposes the anode electrode AE.

That is, the bank BN may cover outer portions of the anode electrode AE, and thus, the opening portion through which light is output in one pixel 110 may be formed. That is, a region, uncovered by the bank BN, of the anode electrode AE illustrated in FIG. 3 may be an opening portion.

To provide an additional description, the bank BN may cover outer portions of the anode electrode AE and may be provided in the display area 120 of the substrate 101 so that the anode electrode AE is exposed.

The bank BN may prevent a phenomenon where lights overlap between adjacent pixels.

The bank BN may be formed of at least one inorganic layer or at least one organic layer, or may be formed of at least one inorganic layer and at least one organic layer.

Subsequently, the light emitting layer EL may be provided on a whole surface of the substrate 101 to cover the anode electrode AE and the bank BN.

The light emitting layer EL may include one of an organic light emitting layer, an inorganic light emitting layer, and a quantum dot light emitting layer, or may include a stack or combination structure of an organic light emitting layer (or an inorganic light emitting layer) and a quantum dot light emitting layer.

The light emitting layer EL may include a hole injection layer (HIL), a hole transport layer (HTL), a hole blocking layer (HBL), an electron injection layer (EIL), an electron transport layer (ETL), an electron blocking layer (EBL), and a charge generating layer (CGL).

In a case where the light emitting layer EL emits white light, the light emitting layer EL may include hole injection layer (HIL)/hole transport layer (HTL), a blue organic layer, electron injection layer (EIL)/charge generating layer (CGL)/electron transport layer (ETL), a red organic layer, a yellow-green organic layer, electron injection layer (EIL)/charge generating layer (CGL)/electron transport layer (ETL), a blue organic layer, electron injection layer (EIL)/electron transport layer (ETL), and an organic buffer, which are sequentially stacked on the anode electrode AE.

The light emitting layer EL may include layers having various stack orders, in addition to layers having a stack order described above.

Subsequently, the cathode electrode CE may be provided on the light emitting layer EL, and particularly, may be provided in a plate shape in the display area 120 and a non-display area 130.

The light emitting layer EL applied to the present disclosure may use the bottom emission type as described above. In this case, the cathode electrode CE may perform a function of reflecting light, emitted from the light emitting layer EL, toward the anode electrode AE. To this end, the cathode electrode CE may include metal such as copper and aluminum.

In case where the light emitting device ED emits white light, a color filter may be provided under the anode electrode AE or in case of a top emission display, on the cathode electrode CE.

Finally, the cathode electrode CE may be covered by the encapsulation layer 106.

The encapsulation layer 106 may be formed of at least one organic layer or at least one inorganic layer, or may be formed of at least one inorganic layer and at least one organic layer.

Water and oxygen flowing in from the outside can be blocked by the encapsulation layer 106 and cannot penetrate into the light emitting layer EL.

The color filter may be provided on the encapsulation layer 106. In this case, the color filter and the encapsulation layer 106 may be covered by an encapsulation substrate.

Figure 4:
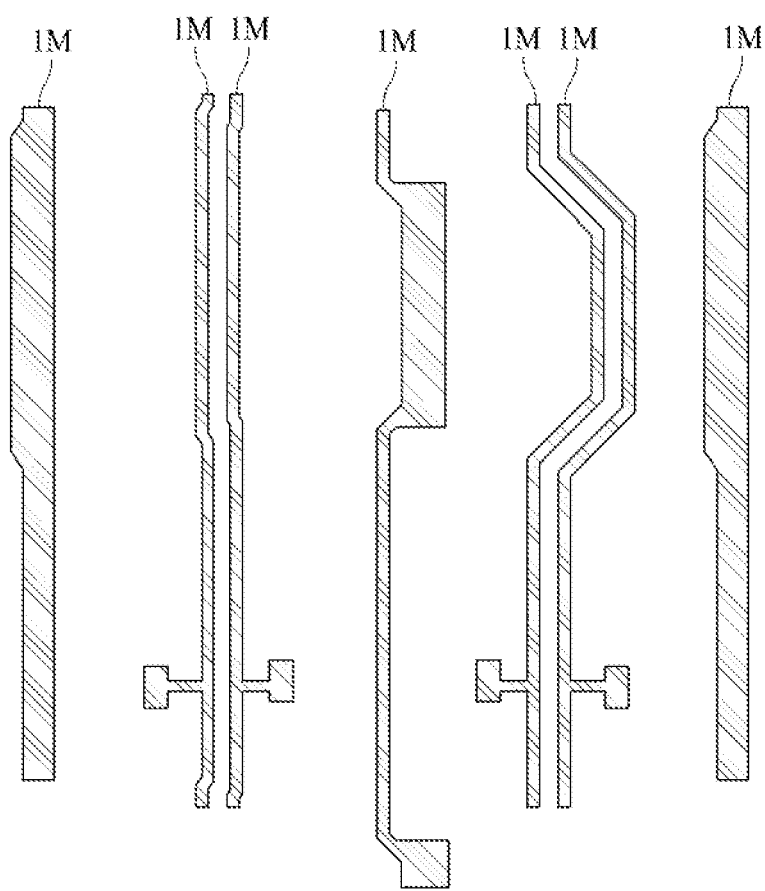
FIG. 4 is an exemplary diagram illustrating first main electrodes included in a first metal layer of a light emitting display apparatus according to the present disclosure.
Figure 5:
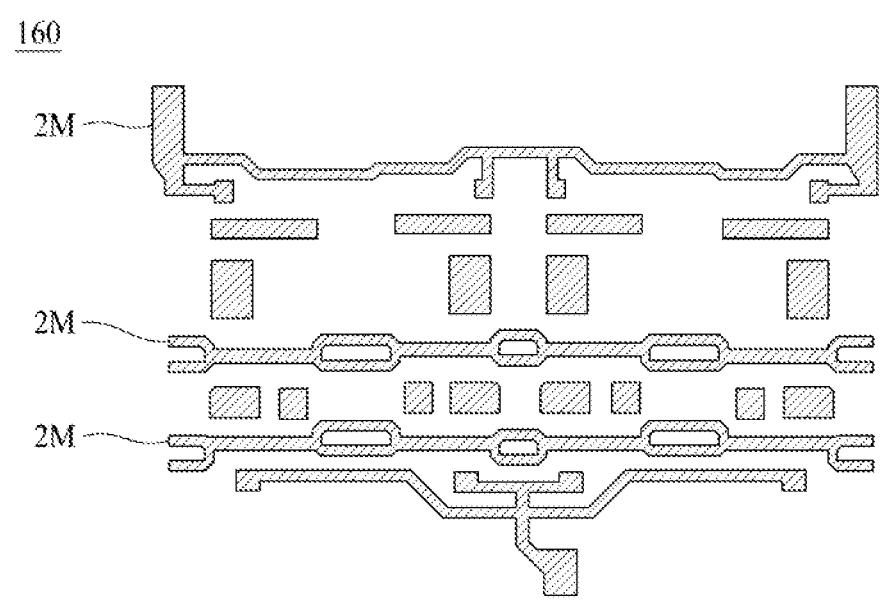
FIG. 5 is an exemplary diagram illustrating second main electrodes included in a second metal layer of a light emitting display apparatus according to the present disclosure.
Figure 6:
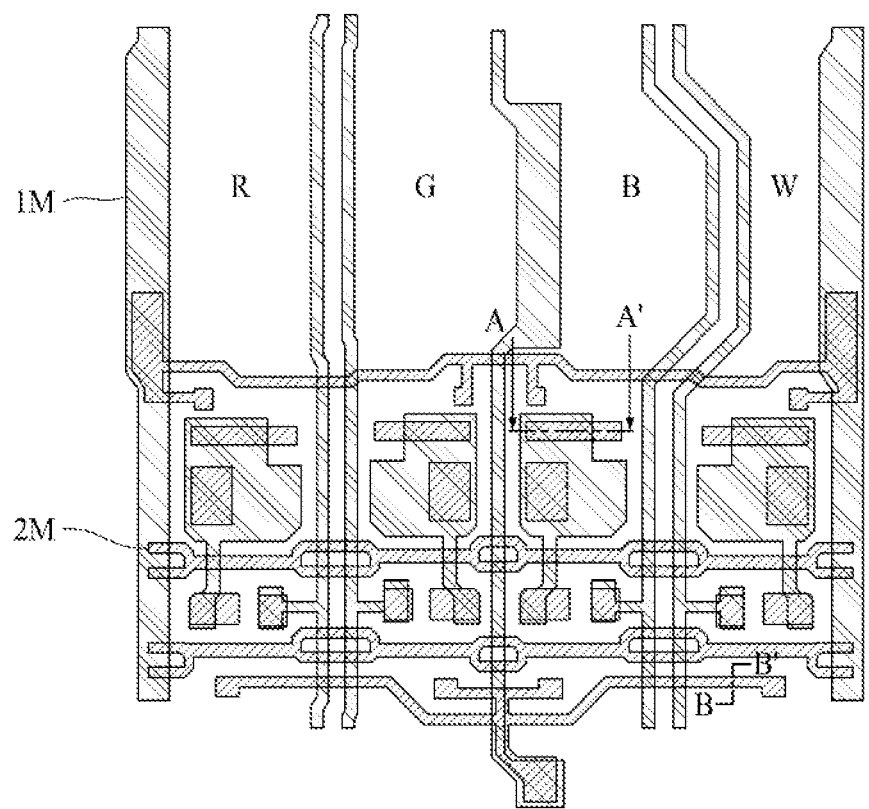
FIG. 6 is an exemplary diagram illustrating the first main electrodes illustrated in FIG. 4 and the second main electrodes illustrated in FIG. 5.

FIG. 4 is an exemplary diagram illustrating first main electrodes included in a first metal layer of a light emitting display apparatus according to the present disclosure. FIG. 5 is an exemplary diagram illustrating second main electrodes included in a second metal layer of a light emitting display apparatus according to the present disclosure. FIG. 6 is an exemplary diagram illustrating first main electrodes illustrated in FIG. 4 and second main electrodes illustrated in FIG. 5. Particularly, FIGS. 4 to 6 illustrate first main electrodes and second main electrodes included in four pixels R, G, B, and W adjacent to one another.

As described above, a pixel driving circuit layer PDL of a light emitting display panel in the present disclosure may include at least two metal layers and at least two insulation layers. Hereinafter, two metal layers may be referred to as a first metal layer 150 and a second metal layer 160.

First, the first metal layer 150 is disposed at a location similar to a light blocking plate LS shown in FIG. 3.

As illustrated in FIG. 4, first main electrodes 1M may be included in the first metal layer 150.

That is, the first metal layer 150 may include the first main electrodes 1M. In this case, a first low reflection electrode 1MTO may be provided under the first main electrode 1M. Accordingly, the first metal layer 150 may include first low reflection electrodes 1MTO and first main electrodes 1M.

Moreover, the first low reflection electrode 1MTO and the first main electrode 1M included in the first metal layer 150 may be a first electrode 1ME which will be described below.

To provide an additional description, the first main electrodes 1M included in the first metal layer 150 may be used as various lines such as gate lines and sensing control lines SCL, and moreover, may be used as the light blocking plate LS. Accordingly, a first electrode 1ME described below may denote one of various lines or a light blocking plate LS.

The first metal layer 150 may be provided on the substrate 101, and the first main electrodes 1M may be included in the first metal layer 150.

The first main electrodes 1M may be one of the light blocking plates LS and the signal lines described above. A signal line formed by the first main electrode 1M may be referred to as a first signal line.

The first main electrodes 1M may include copper (Cu), or may be formed of at least one of various metal materials in addition to Cu. For example, the first main electrodes 1M may include metal such as molybdenum, aluminum, tungsten, and titanium, or an alloy thereof. Also, the first main electrode 1M may include single metal such as Cu, or may be formed by stacking two or more metal layers.

The second metal layer 160 may denote a layer which includes the gate G of the driving transistor Tdr in FIG. 3.

The second main electrodes 2M, as illustrated in FIG. 5, may be included in the second metal layer 160.

That is, the second metal layer 160 may include the second main electrodes 2M. In this case, a second low reflection electrode 2MTO may be provided under the second main electrode 2M. Accordingly, the second metal layer 160 may include second low reflection electrodes 2MTO and second main electrodes 2M.

Moreover, the second low reflection electrode 2MTO and the second main electrode 2M included in the second metal layer 160 may be a second electrode 2ME which will be described below.

To provide an additional description, the second main electrodes 2M included in the second metal layer 160 may be used as various lines such as data lines and power lines, and moreover, may be used as electrodes for transistors. Accordingly, a second electrode 2ME described below may denote one of various kinds of lines or one of electrodes configuring transistors.

The second metal layer 160 may overlap with the first metal layer 150 with an insulation layer therebetween. The second metal layer 160 may be provided on the first metal layer 150 with the insulation layer therebetween, and second main electrodes 2M may be included in the second metal layer 160. Here, the insulation layer may be at least one of a buffer 102 and a gate insulation layer 103.

The second main electrodes 2M, as described above, may be one of a gate G of a driving transistor Tdr, gates G of other transistors, and signal lines. A signal line formed by the second main electrode 2M may be referred to as a second signal line.

The second main electrodes 2M may be formed of a double layer including copper and an alloy (MoTi) of molybdenum and titanium. However, the second main electrodes 2M may be formed of only an alloy (MoTi) of molybdenum and titanium. However, the present disclosure is not limited thereto, and the second main electrode 2M may include a metal material having an etch rate which is lower than that of the second low reflection electrode 2MTO. For example, an etch rate of the second main electrode 2M may be lower than that of the second low reflection electrode 2MTO disposed under the second main electrode 2M.

Figure 7:
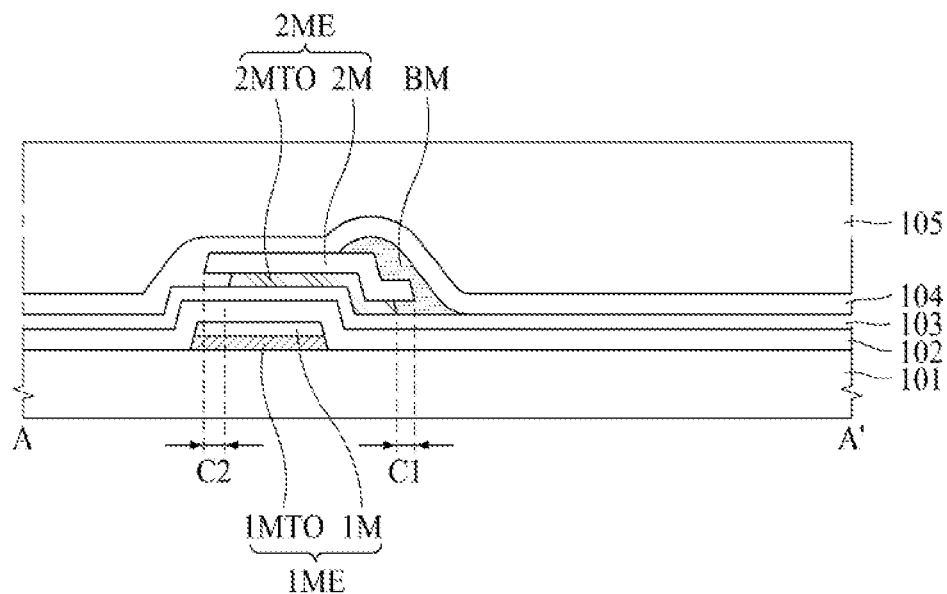
FIG. 7 is an exemplary diagram illustrating a cross-sectional view taken along line A-A' illustrated in FIG. 6.
Figure 8:
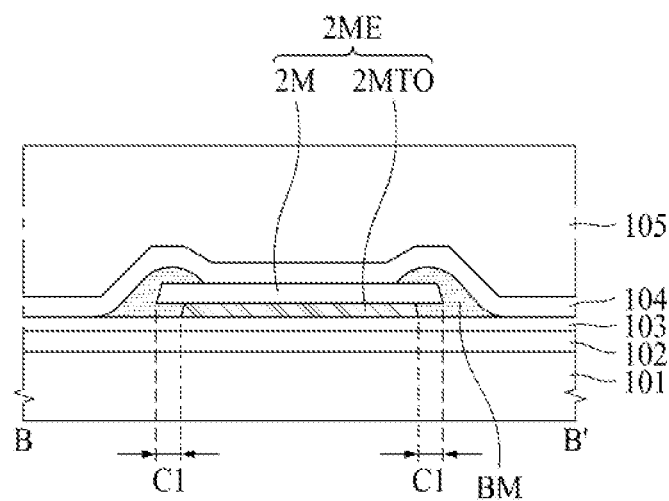
FIG. 8 is an exemplary diagram illustrating a cross-sectional view taken along line B-B' illustrated in FIG. 6.
Figure 9:
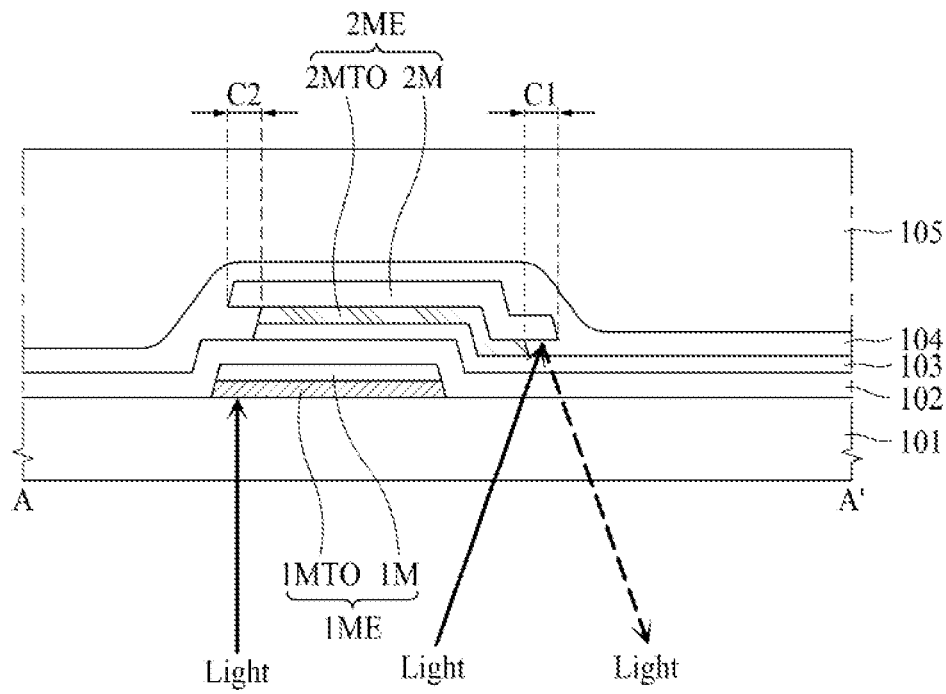
FIG. 9 is an exemplary diagram for describing a phenomenon where the reflection of light occurs in a light emitting display panel.

FIG. 7 is an exemplary diagram illustrating a cross-sectional view taken along line A-A' illustrated in FIG. 6, FIG. 8 is an exemplary diagram illustrating a cross-sectional view taken along line B-B' illustrated in FIG. 6, and FIG. 9 is an exemplary diagram for describing a phenomenon where the reflection of light occurs in a light emitting display panel.

As described above, a pixel driving circuit layer PDL of a light emitting display panel in the present disclosure may include at least two metal layers and at least two insulation layers.

In this case, the first main electrodes 1M may be included in the first metal layer 150 provided on the substrate 101, and the second main electrodes 2M may be included in the second metal layer 160 provided on the first metal layer 150 with the insulation layer therebetween.

That is, the pixel driving circuit layer PDL may include the second main electrode 2M provided on the first main electrode 1M with the insulation layer therebetween.

In this case, as illustrated in FIG. 7, the first low reflection electrode 1MTO may be provided under the first main electrode 1M, and the second low reflection electrode 2MTO may be provided under the second main electrode 2M.

The first main electrode 1M may include copper, the second main electrode 2M may include copper and an alloy (MoTi) of molybdenum and titanium, and the first low reflection electrode 1MTO and the second low reflection electrode 2MTO may include molybdenum tantalum oxide (MTO). In more detail, the first low reflection electrode 1MTO and the second low reflection electrode 2MTO may be molybdenum tantalum oxide (MoTaOx).

In this case, the first low reflection electrode 1MTO and the second low reflection electrode 2MTO may include oxide metal such as molybdenum titanium oxide (MoTiOx), molybdenum chrome oxide (MoCrOx), and tungsten oxide (Wox), in addition to molybdenum tantalum oxide (MoTaOx).

The first main electrode 1M and the second main electrode 2M may include different metals, and molybdenum tantalum oxide (MTO) may be provided under each of the first main electrode 1M and the second main electrode 2M. Particularly, the second main electrode 2M may be formed of a double layer including an alloy (MoTi) and copper, and the first main electrode 1M may include copper. However, as described above, the first main electrode 1M may be formed of a multilayer, and the second main electrode 2M may be formed of a single layer.

In this case, a first electrode 1ME including the first main electrode 1M and the first low reflection electrode 1MTO may be a light blocking plate LS or a first signal line included in a pixel driving circuit layer.

That is, the first main electrode 1M may be the light blocking plate LS or the first signal line, but in the present disclosure, the first low reflection electrode 1MTO including a material having a low reflectance may be provided under the first main electrode 1M, so as to prevent external light from being reflected by the first main electrode 1M. Accordingly, the first electrode 1ME including the first main electrode 1M and the first low reflection electrode 1MTO may be the light blocking plate LS or the first signal line.

Moreover, a second electrode 2ME including the second main electrode 2M and the second low reflection electrode 2MTO may be a gate G of a transistor or a second signal line included in the pixel driving circuit layer.

That is, the second main electrode 2M may be the gate G or the second signal line, but in the present disclosure, the second low reflection electrode 2MTO including a material having a low reflectance may be provided under the second main electrode 2M, so as to prevent external light from being reflected by the second main electrode 2M. Accordingly, the second electrode 2ME including the second main electrode 2M and the second low reflection electrode 2MTO may be the gate G of the transistor or the second signal line.

In this case, the insulation layer may be provided between the first electrode 1ME and the second electrode 2ME and may be at least one of the buffer 102 and the gate insulation layer 103.

In the present disclosure, as illustrated in FIGS. 7 and 8, an outer portion of a first region C1, which does not overlap with the first electrode 1ME, of the second electrode 2ME may be covered by a black material BM. The black material BM may be one of materials which have a black color and are used as a black matrix, or may be one of materials which have a black color and are used as a black bank. For example, the black material BM may include a negative photoresist (RP).

That is, the black material BM may be formed by mixing a chrome-based metal material or a carbon-based organic material with a photoresist including a light polymerizable initiator, a binder resin, a polymer monomer, and a solvent. Also, the black material BM may include a black matrix using an organic material including carbon black, or may include a black matrix using compound metal oxide, or may include a black matrix using an inorganic material, or may include an organic material including carbon black.

Hereinafter, the reason that a black material is provided at the outer portion of the first region C1 of the second electrode 2ME which does not overlap with the first electrode 1ME will be briefly described.

For example, the first main electrode 1M may include copper, the second main electrode 2M may include copper and an alloy (MoTi) of molybdenum and titanium, and the first low reflection electrode 1MTO and the second low reflection electrode 2MTO may include molybdenum tantalum oxide (MTO).

The first low reflection electrode 1MTO may be provided for preventing light, penetrating into a lower end of the first main electrode 1M, from being reflected by the first main electrode 1M, and the second low reflection electrode 2MTO may be provided for preventing light, penetrating into a lower end of the second main electrode 2M, from being reflected by the second main electrode 2M.

To this end, in a manufacturing process of a light emitting display panel, molybdenum tantalum oxide (MTO) and copper included in the first electrode 1ME may be sequentially deposited on a substrate. Subsequently, molybdenum tantalum oxide (MTO) and copper may be etched by an etching process so as to form the first electrode 1ME.

In this case, because an etching characteristic of molybdenum tantalum oxide (MTO) is similar to that of copper, molybdenum tantalum oxide (MTO) and copper may be etched as a similar type.

Through such a process, the first electrode 1ME may be formed, and then, the first electrode 1ME may be covered by the buffer 102 and the gate insulation layer 103.

Materials (i.e., molybdenum tantalum oxide (MTO), copper, and MoTi) included in the second electrode 2ME may be sequentially deposited on the gate insulation layer 103.

Subsequently, molybdenum tantalum oxide (MTO), copper, and MoTi may be etched by an etching process so as to form the second electrode 2ME.

In this case, MoTi included in the second main electrode 2M may have a characteristic where MoTi is less etched than molybdenum tantalum oxide (MTO) included in the second low reflection electrode 2MTO.

Therefore, in the second electrode 2ME which is formed after molybdenum tantalum oxide (MTO), copper, and MoTi are etched, as in FIGS. 7 and 8, an end of the second main electrode 2M may more protrude than an end of the second low reflection electrode 2MTO. As described above, the end of the second main electrode 2M having an etching rate which is less than that of the second low reflection electrode 2MTO may more protrude than the end of the second low reflection electrode 2MTO.

As in the present disclosure, in a light emitting display apparatus using a bottom emission type, external light may be incident on an inner portion of the light emitting display panel 100 from a direction toward the substrate 101.

In this case, in a light emitting display panel of the related art as illustrated in FIG. 9, because the end of the second main electrode 2M protrudes more than the end of the second low reflection electrode 2MTO, external light may be reflected by the protruded first region C1, and then, may be discharged to the outside of the light emitting display apparatus through the substrate 101. However, because the second low reflection electrode 2MTO is provided in a second region C2, light may not be reflected in the second region C2.

In order to prevent light from being reflected in the first region C1 as illustrated in FIG. 9, in the present disclosure, the first region C1 where the end of the second main electrode 2M protrudes more than the end of the second low reflection electrode 2MTO may be covered by the black material BM.

The first region C1 may denote a region, which does not overlap with the first electrode 1ME, of the second electrode 2ME. Particularly, the first region C1 may denote a region, which does not overlap with the first electrode 1ME, of ends of the second electrode 2ME.

That is, as illustrated in FIG. 7, in the second region C2, overlapping with the first electrode 1ME, of the second electrode 2ME, although the end of the second main electrode 2M protrudes more than the end of the second low reflection electrode 2MTO, a protruded portion may be covered by the first electrode 1ME. Accordingly, light penetrating through the substrate 101 may not penetrate into the second region C2, and thus, external light may not be reflected in the second region C2.

Therefore, the black material BM may not be provided in the second region C2.

However, the black material BM may be provided to cover all of the second electrode 2ME.

Hereinafter, features of the present disclosure will be described with reference to FIGS. 7 and 8. Here, FIG. 7 illustrates a cross-sectional view of a region where the first electrode 1ME overlaps with a portion of the second electrode 2ME. FIG. 8 illustrates a cross-sectional view of a region where the first electrode 1ME does not overlap with the second electrode 2ME, namely, a cross-sectional view of a region where only the second electrode 2ME is provided.

First, the insulation layer may be provided between the first electrode 1ME and the second electrode 2ME and may be at least one of the buffer 102 and the gate insulation layer 103.

In this case, the first electrode 1ME may overlap with the second electrode 2ME as illustrated in FIG. 7, or may not overlap with the second electrode 2ME as illustrated in FIG. 8. Also, as illustrated in FIG. 7, only a portion of the second electrode 2ME may overlap with the first electrode 1ME, and all of the second electrode 2ME may overlap with the first electrode 1ME.

When the second electrode 2ME fully overlaps with the first electrode 1ME, as described above, external light may penetrate into the second electrode 2ME, and thus, reflection may not occur in the second electrode 2ME. Accordingly, a description of a case where the second electrode 2ME fully overlaps with the first electrode 1ME is omitted.

Subsequently, as described above, an outer portion of the first region C1, which does not overlap with the first electrode 1ME, of the second electrode 2ME may be covered by the black material BM.

In this case, as illustrated in FIGS. 7 and 8, the black material BM and the second electrode 2ME may be covered by a passivation layer 104, and the passivation layer 104 may be covered by a planarization layer 105.

However, the passivation layer 104 may be omitted. In aspects described below, the passivation layer 104 may be omitted also.

Subsequently, as illustrated in FIG. 7, an outer portion of the second region C2, overlapping with the first electrode 1ME, of the second electrode 2ME may be covered by the passivation layer 103, and the passivation layer 103 may be covered by the planarization layer 105.

Subsequently, as illustrated in FIG. 8, when the second electrode 2ME does not overlap with the first electrode 1ME, a whole outer portion, which does not overlap with the first electrode 1ME, of the second electrode 2ME may be covered by the black material BM.

In this case, the black material BM and the second electrode 2ME may be covered by the passivation layer 104, and the passivation layer 104 may be covered by the planarization layer 105.

Subsequently, as described above, the end of the second main electrode 2M may more protrude in an outward direction than the end of the second low reflection electrode 2MTO.

That is, because MoTi included in the second main electrode 2M is less etched than molybdenum tantalum oxide (MTO) included in the second low reflection electrode 2MTO in an etching process, the end of the second main electrode 2M may more protrude in an outward direction than the end of the second low reflection electrode 2MTO.

An outer portion of the first region C1, which does not overlap with the first electrode 1ME, of the end of the second main electrode 2M may be covered by the black material BM as illustrated in FIGS. 7 and 8. In this case, an outer portion of the second region C2, overlapping with the first electrode 1ME, of the end of the second main electrode 2M, the black material BM, and the second main electrode 2M may be covered by the passivation layer 104 as illustrated in FIG. 7, and the passivation layer 104 may be covered by the planarization layer 105.

However, as illustrated in FIG. 8, when there is no second region, overlapping with the first electrode 1ME, of the end of the second main electrode 2M, the second main electrode 2M and the black material BM included in the first region C1 may be covered by the passivation layer 104, and the passivation layer 104 may be covered by the planarization layer 105.

Finally, a distance between the end of the second main electrode 2M and the end of the second low reflection electrode 2MTO may be greater than a distance between the end of the first main electrode 1M and the end of the first low reflection electrode 1MTO.

That is, because MoTi included in the second main electrode 2M is less etched than molybdenum tantalum oxide (MTO) included in the second low reflection electrode 2MTO, the end of the second main electrode 2M may more protrude in an outward direction than the end of the second low reflection electrode 2MTO.

However, an etching characteristic of copper included in the first main electrode 1M may be almost similar to an etching characteristic of molybdenum tantalum oxide (MTO) included in the first low reflection electrode 1MTO.

Therefore, a distance between the end of the second main electrode 2M and the end of the second low reflection electrode 2MTO may be greater than a distance between the end of the first main electrode 1M and the end of the first low reflection electrode 1MTO.

An outer portion of the first region C1, which does not overlap with the first electrode 1ME, of the end of the second main electrode 2M may be covered by the black material BM, an outer portion of the second region C2, overlapping with the first electrode 1ME, of the end of the second main electrode 2M, the black material BM, and the second main electrode 2M may be covered by the passivation layer 104, and the passivation layer 104 may be covered by the planarization layer 105.

However, as illustrated in FIG. 8, when there is no second region, overlapping with the first electrode 1ME, of the end of the second main electrode 2M, the second main electrode 2M and the black material BM included in the first region C1 may be covered by the passivation layer 104, and the passivation layer 104 may be covered by the planarization layer 105.

As described above, according to the present disclosure, because an outer portion of the first region C1, which does not overlap with the first electrode 1ME, of the end of the second main electrode 2M is covered by the black material BM, the reflection of external light may not occur in the first region C1, thereby enhancing the quality of a light emitting display apparatus.

Figure 10:
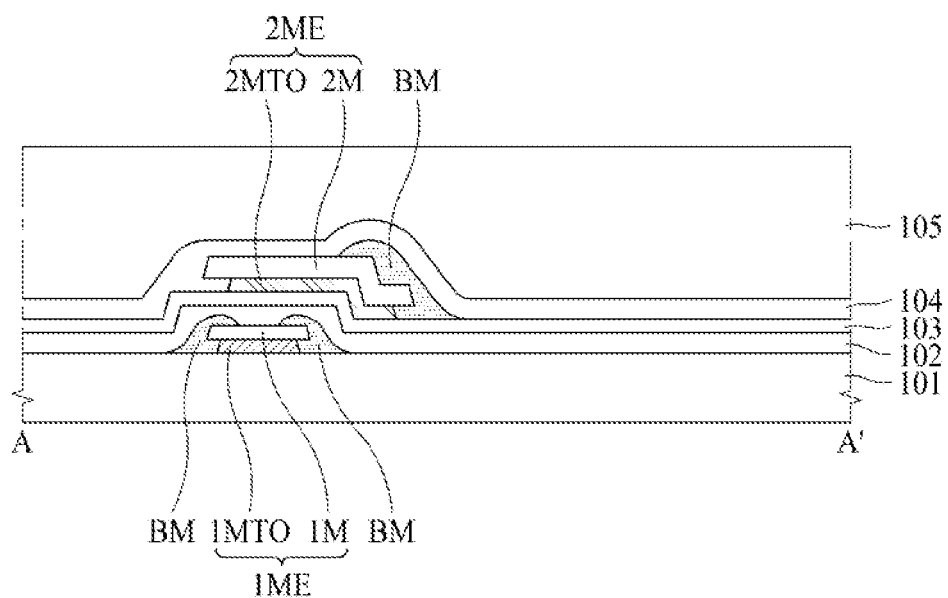
FIG. 10 is another exemplary diagram illustrating a cross-sectional view taken along line A-A' illustrated in FIG. 6.

FIG. 10 is another exemplary diagram illustrating a cross-sectional view taken along line A-A' illustrated in FIG. 6.

As described above, the second main electrode 2M included in the second electrode 1ME may include a metal material which is less in etching rate than the second low reflection electrode 2MTO. In this case, as described above with reference to FIGS. 7 to 9, the end of the second main electrode 2M may not be covered by the second low reflection electrode 2MTO and may be exposed, and thus, as illustrated in FIG. 9, the reflection of light may occur in the end of the second main electrode 2M.

However, a phenomenon described above may also occur in the first electrode 1ME as well as the second electrode 2ME.

For example, in a case where the first electrode 1ME includes the first main electrode 1M and the first low reflection electrode 1MTO, when the first main electrode 1M includes a metal material which is less in etching rate than the first low reflection electrode 1MTO, a phenomenon where light is reflected may occur in the first electrode 1ME.

In this case, as illustrated in FIG. 10, the black material BM may be provided at ends of the first electrode 1ME, and thus, light penetrating into the ends of the first electrode 1ME may not be reflected.

In this case, an insulation layer such as oxide silicone (SiO2) may be provided in a pattern shape under the first low reflection electrode 1MTO, or may be provided as one layer.

To provide an additional description, the present disclosure may be applied to various cases where an end of a metal material is not covered by a low reflection electrode due to an etching rate difference between the low reflection electrode and the metal material when a metal electrode is formed of the low reflection electrode and the metal material.

According to the present disclosure, because a low reflection electrode is provided under a main electrode, reflected light reflected from a lower end of the main electrode to the outside may be reduced.

In this case, a region, uncovered by the low reflection electrode, of an outer portion of the main electrode may be covered by a black material. Accordingly, reflected light reflected from the outer portion of the main electrode to the outside may be reduced.

Accordingly, reflected light reflected to the outside by a light emitting display apparatus may be removed or reduced, and thus, the image quality of a light emitting display apparatus may be enhanced even without a polarization film.

The above-described feature, structure, and effect of the present disclosure are included in at least one aspect of the present disclosure, but are not limited to only one aspect. Furthermore, the feature, structure, and effect described in at least one aspect of the present disclosure may be implemented through combination or modification of other aspects by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A light emitting display apparatus comprising:
   a substrate;
   a pixel driving circuit layer provided in the substrate and including a driving transistor;
   a planarization layer provided on the pixel driving circuit layer; and
   an anode electrode provided on the planarization layer and connected to the driving transistor of the pixel driving circuit layer,
   wherein the pixel driving circuit layer further includes a first main electrode and a second main electrode provided on the first main electrode with an insulation layer therebetween,
   a first low reflection electrode provided under the first main electrode; and
   a second low reflection electrode provided under the second main electrode.

2. The light emitting display apparatus of claim 1, wherein the first low reflection electrode and the second low reflection electrode include oxide metal.

3. The light emitting display apparatus of claim 1, wherein the first main electrode and the first low reflection electrode constitute a first electrode, and the second main electrode and the second low reflection electrode constitute a second electrode, and
   wherein the insulation layer is disposed between the first electrode and the second electrode.

4. The light emitting display apparatus of claim 3, further comprising a black material covering a first region where the first electrode and the second electrode do not overlap with each other.

5. The light emitting display apparatus of claim 4, further comprising a passivation layer covering the black material and the second electrode.

6. The light emitting display apparatus of claim 5, wherein the passivation layer covers a second region where the first electrode and the second electrode overlapping with each other.

7. The light emitting display apparatus of claim 3, further comprising a black material covering an outer region of the second electrode that does not overlap with the first electrode.

8. The light emitting display apparatus of claim 7, further comprising a passivation layer covering the black material and the second electrode,
   wherein the passivation layer is covered by the planarization layer.

9. The light emitting display apparatus of claim 3, wherein the second main electrode having an end portion protruding more than an end portion of the second low reflection electrode.

10. The light emitting display apparatus of claim 9, further comprising:
    a black material covering a first region where the second main electrode does not overlap with the first electrode; and
    a passivation layer covering the end portion of the second main electrode, the black material and a second region where the second main electrode overlaps with the first electrode,
    wherein the passivation layer is covered by the planarization layer.

11. The light emitting display apparatus of claim 3, wherein a distance between an end of the second main electrode and an end of the second low reflection electrode is greater than a distance between an end of the first main electrode and an end of the first low reflection electrode.

12. The light emitting display apparatus of claim 11, further comprising:
    a black material covering a first region where the second main electrode does not overlap with the first electrode,
    a passivation layer covering the end of the second main electrode, the black material, a second region where the second main electrode overlaps with the first electrode,
    wherein the passivation layer is covered by the planarization layer.

13. The light emitting display apparatus of claim 3, further comprising a black material covering an outer portion of the first electrode when an etching rate of the first main electrode is lower than an etching rate of the first low reflection electrode.

14. The light emitting display apparatus of claim 3, further comprising a black material covering an outer portion of the second electrode when an etching rate of the second main electrode is lower than an etching rate of the second low reflection electrode, wherein an end of the second electrode is not covered by the first electrode.

15. The light emitting display apparatus of claim 14, further comprising a black material covering an outer portion of the first electrode when an etching rate of the first main electrode is less than an etching rate of the first low reflection electrode.

16. A light emitting display apparatus comprising:
a substrate;
a first low reflection electrode disposed on the substrate;
a first main electrode disposed on the first low reflection electrode;
an insulation layer disposed on the substrate and covering the first low reflection electrode and the first main electrode;
a second low reflection electrode disposed on the insulation layer;
a second main electrode disposed on second low reflection electrode; and a black material covering a portion of the second main electrode that does overlap with the first main electrode.

17. The light emitting display apparatus of claim 16, further comprising a passivation layer covering the black material and the insulation layer.

18. The light emitting display apparatus of claim 16, wherein the second main electrode having a first end portion protruding more than a first end portion of the second low reflection electrode.

19. The light emitting display apparatus of claim 16, wherein the second main electrode having a second end portion protruding more than a second end portion of the second low reflection electrode, and wherein the second end portion of the second main electrode overlaps with the first low reflection electrode and the first main electrode.

20. The light emitting display apparatus of claim 16, wherein the first main electrode having both end portions protruding more than both end portions of the first low reflection electrode, and wherein the both end portions of the first main electrode are covered by the black material.

* * * * *